SEMICONDUCTOR DEVICE AND METHOD OF MANUFACTURING THE SAME

Original Filed June 6, 1966

INVENTORS.
TOSHIAKI IRIE
YOSHIYUKI NANKO
Hopgood and Calimafde
ATTORNEYS.

SEMICONDUCTOR DEVICE AND METHOD OF MANUFACTURING THE SAME

INVENTORS.
TOSHIAKI IRIE
YOSHIYUKI NANKO

Haseltine and Colemanfield

ATTORNEYS.

United States Patent Office 3,550,292

Patented Dec. 29, 1970

3,550,292

SEMICONDUCTOR DEVICE AND METHOD OF MANUFACTURING THE SAME

Toshiaki Irie and Yoshiyuki Nanko, Tokyo, Japan, assignors to Nippon Electric Company, Limited, Tokyo, Japan, a corporation of Japan

Original application June 6, 1966, Ser. No. 555,332. Divided and this application Aug. 23, 1968, Ser. No. 777,522

Int. Cl. H01l *7/34*

U.S. Cl. 148—1.5 1 Claim

ABSTRACT OF THE DISCLOSURE

Disclosed is a method of making a semiconductor device by covering a portion of a surface of a silicon substrate with a silicon oxide film, oxidizing the remainder of the surface thereby forming a mesa structure due to the difference in oxidation rates, removing at least a portion of the first formed silicon oxide film and forming at least one p-n junction therein.

Figure 1A:
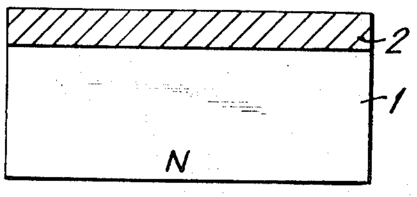

This is a division of application Ser. No. 555,332 filed June 6, 1966, now abandoned.

The present invention relates to semiconductor devices generally and in particular, to a transistor structure for ultra high frequency applications, and having a high breakdown voltage.

It is known that the capacitance of that portion of the collector-base junction of an ultra high frequency transistor which is inevitably added during fabrication is much higher than the capacitance of that portion of the collector-base junction which corresponds to the active region of the minority carriers since the emitter area of such transistor is designed extremely small in order to improve the cutoff frequency. The dimension of the entire device is so small that the direct attachment of lead wires to the electrodes, in the assembly process, is difficult and consequently, planar transistors are ordinarily provided with landing areas for the electrodes (extending from the actual electrodes) with the lead wires attached to the landing areas.

It has been experimentally confirmed that the aforementioned unnecessary base-collector junction capacitance inevitably introduced by the structured modification during the fabrication and the additional capacitance due to the aforementioned extended lead electrodes seriously affect the high frequency parameters of the transistor, deteriorating them in the high frequency region.

It is, therefore, the object of the present invention to eliminate a large portion of the base-collector junction capacitance, inevitably introduced by the structure during fabrication, in order to prevent the deterioration in the high frequency power gain.

It is another object of the present invention to reduce the additional capacitance introduced by the extended lead electrodes with landing areas for attaching lead wires.

In the transistor of this invention, the unnecessary base-collector junction is almost completely removed. Further, since, as will be explained, the landing area from the actual electrode extends over the silicon oxide film with considerable thickness, the capacity between the landing area and collector region is minimized. Thus, this invention prevents the deterioration of high frequency power gain.

It has also been known that the reliability of the mesa type semiconductor device is affected because of its exposed junction, whereas, with a planar type device, this problem is almost non-existent because of the planar technique of covering the junction portion with a film of, for example, silicon oxide. The breakdown voltage of the junction in a planar type device, however, is lower than the mesa type due to its structure or fabrication method.

It is, therefore, a further object of the present invention to provide a semiconductor device having superior breakdown voltage characteristics.

It is a still further object of the present invention to provide a device with both mesa and planar advantages and, accordingly, to provide the junction portion of the finished device as well as that of the device during the fabrication process, in almost the same manner as the planar type semiconductor device.

Thus, the transistor in accordance with the present invention has the advantages of both mesa and planar type semiconductor devices, and its structure gives even better breakdown voltage characteristics than the mesa type semiconductor device. It has a high breakdown voltage and exceedingly small base-collector junction capacitance as well as extremely small parasitic capacitances between the landing area and collector electrode (in the case of the device with extended lead electrodes), thus having highly stable high frequency power gain.

Figure 1B:
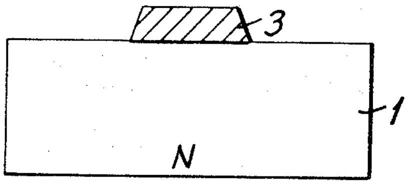
Figure 1C:
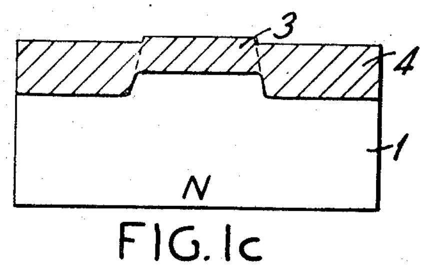
Figure 1D:
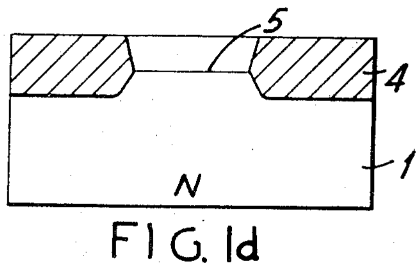
Figure 1E:
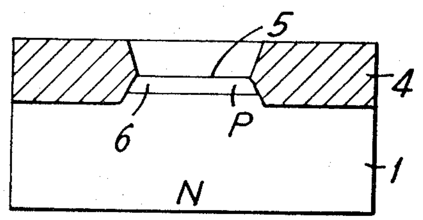
Figure 1F:
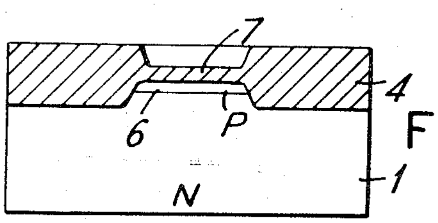
Figure 1G:
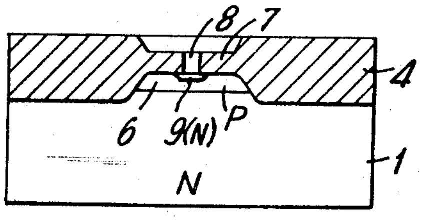
Figure 1H:
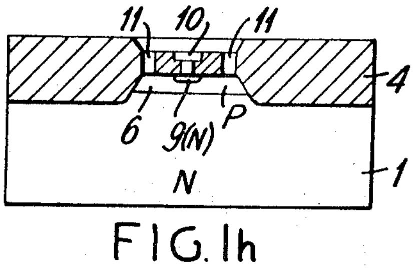
Figure 1I:
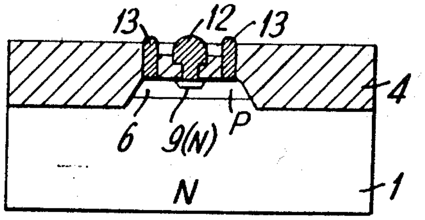
Figure 1J:
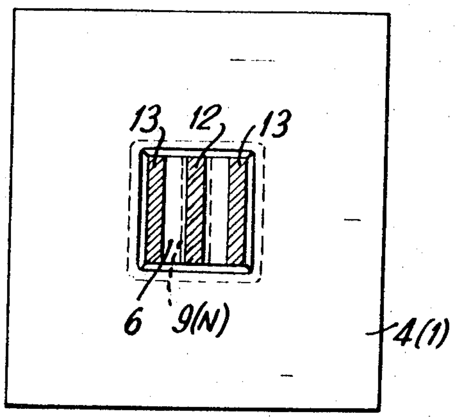
Figure 2A:
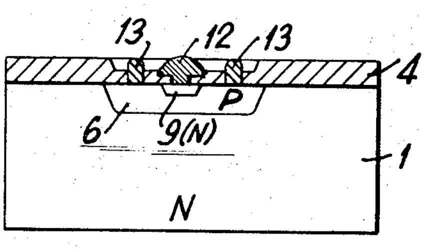
Figure 2B:
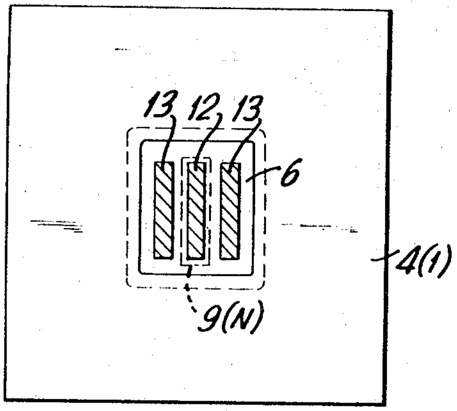
Figure 3A:
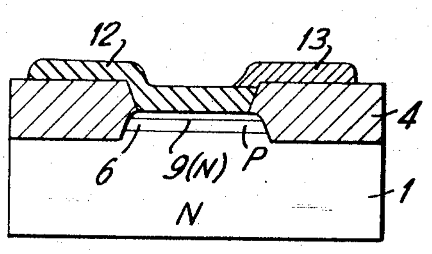
Figure 3B:
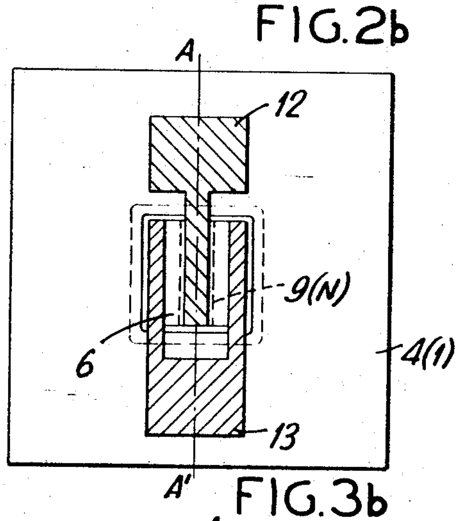
Figure 4A:
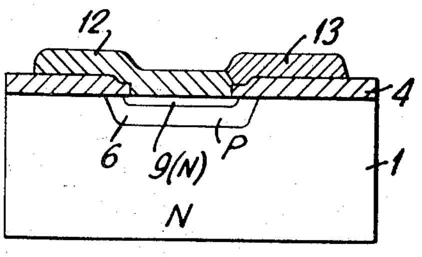
Figure 4B:
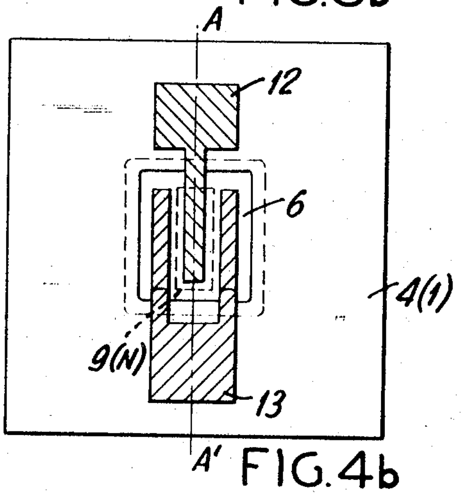

The present invention will now be described in detail referring to the structure of NPN silicon transistors and the method of fabricating the same, and the above mentioned and other features and objects of this invention and the manner of attaining them will become more apparent and the invention itself will best be understood by reference to the following description of embodiments of the invention taken in conjunction with the accompanying drawings wherein:

FIGS. 1*a* through 1*i* are cross sectional views of one embodiment of a semiconductor device of the present invention as it would appear at the various stages in the fabricating process, and FIG. 1*j* is a plan view of the device of FIG. 1*i*;

FIGS. 2*a* and 2*b* are cross sectional and plan views, respectively, of a conventional silicon NPN planar transistor;

FIGS. 3*a* and 3*b* are cross sectional and plan views, respectively, of an embodiment of the present invention with extended lead electrodes; and FIGS. 4*a* and 4*b* are cross sectional and plan views, respectively, of a conventional NPN silicon planar transistor with extended lead electrodes.

Referring now to FIG. 1*a*, an N type silicon substrate 1 with a silicon oxide film 2 formed thereon is first prepared. Although the thickness of the film 2 is determined by the device design, it is essential that it be much thicker than what is formed during the fabrication of a conventional planar transistor; at least 0.003 mm. or more in accordance with the present invention.

In FIG. 1*b*, the silicon oxide film 2 is removed by means of photoetching (or electron beam technique) save the portion 3 which has an area sufficient to form the device functions. An alternative method of forming the portion 3 is to selectively evaporate silicon dioxide or thermally decompose organic silicon so as to selectively form silicon oxide. The silicon block as shown in FIG. 1*b* is then heated at 900° C.–1,200° C. in an oxidizing atmosphere to form a silicon oxide surface film. It is well known that the thickness of the oxide film thus formed is proportional to the square root of the oxidation period. The increment of thickness of the portion 3 is therefore far less than the film thickness of the portion 4 thus formed. If a thick silicon oxide film 3 is left, the increment of the thickness of the film 3 becomes almost negligible. It is also known that 44±2% of the entire thickness of the oxide film thermally formed grows above the silicon surface level prior to the oxidation and the rest, or 56±2% grows below the same.

Consequently, as shown in FIG. 1*c*, the surface of the silicon substrate 1 beneath the silicon oxide film 3 and 4 is a mesa structure because of the difference in the thickness of the newly formed oxide film 4 and the increment to the thickness of the film 3. It is a feature of the present invention to form such a mesa structure at the interface of the silicon substrate and oxide film, utilizing the difference in the speed of the film growth on the silicon surface and oxide film left from the previous process.

As may be seen in FIG. 1*d*, the portion 3 of the silicon oxide film is then entirely removed, exposing a portion 5 of the silicon surface. This opening is for the base-collector junction to be formed. Subsequently, a P type base region 6 is formed, as shown in FIG. 1*e*, by means of epitaxial growth or impurity diffusion. Where a diode is being manufactured, an electrode is formed on the region 6. Although the P type region 6 is formed within the mesa structure in this embodiment, the depth of the region 6 entirely depends on the design of the device. In FIG. 1*f*, a silicon oxide film 7 is formed on the surface 5 of the mesa structure. The film 7 may be formed by thermal decomposition of organic silicon, silicon tetrachloride, or the like, or by oxidation of the silicon substrate in an oxidizing atmosphere.

It is another fetaure of the invention to choose the thickness of the silicon oxide film 7 such that the surface of the film 7 is as near as possible to the surface of the oxide film 4 formed in the process shown in FIG. 1*c*. Thus, the surface of the entire block becomes substantially flat, or planar, while the silicon surface has a mesa structure.

This planar oxide surface is very convenient for the extended lead electrode structure. Referring to FIG. 1*g*, an opening 8 is formed through the silicon oxide film 7 by photoetching, and thereafter, an N type emitter region 9 is formed by diffusing impurities therethrough. After oxidizing the element shown in FIG. 1*g* in order to form a slight oxide film on the surface of the emitter region 9, openings 10 and 11 for the emitter and base electrodes are formed, as shown in FIG. 1*h*. This may be accomplished by photoetching in the same manner as the planar transistor fabrication. Finally, referring to FIGS. 1*i* and *j*, emitter 12 and base 13 electrodes are attached to the respective regions through the openings 10 and 11.

FIGS. 2*a* and 2*b* show a planar NPN transistor which is conventionally fabricated so as to have the same emitter and base electrode dimensions, emitter-base spacings, and depth of impurity diffusion as the previous embodiment shown in FIGS. 1*a* through 1*h*. For convenience, the same reference numerals are used in FIGS. 2*a* and 2*b* to indicate similar portions to those in FIG. 1.

It will be understood, of course, that the collector-base junction area in the conventional planar transistor must be determined so that the base-emitter junction and base electrode do not overlap the collector-base junction. This is due to the fact that a side portion of the emitter-base junction and a side portion of the collector-base junction as well as the electrode contact portions are all on the same plane. Therefore, an alignment tolerance must be taken into account in designing openings for emitter diffusion and the base electrode contact in order to avoid the described overlapping. In greater detail, the collector-base junction is designed to be separate from the openings for the emitter region and base electrode contact. This area of the collector-base junction corresponding to the alignment tolerance is unnecessary for the transistor operation.

With the instant invention, on the other hand, the emitter-base junction and the collector-base junction are not in the same plane, nor are the base electrode contact and collector-base junction, notwithstanding the same emitter electrode-base electrode spacings as the conventional structure. Accordingly, their overlapping in the plan view does not disadvantage the device. The limitation of the alignment tolerance, and the formation of unnecessary junction areas are thereby eliminated.

The unnecessary collector-base junction area greatly affects the characteristic parameters of the transistor in the high frequency region, and in particular, the high frequency power gain. The structure of the present invention is extremely effective to prevent this defect. Further technical merits of the invention will be understood from the following description.

FIGS. 3*a* and 3*b* show another embodiment of the present invention wherein the dimensions of the device are extremely small, as in ultra high frequency transistors, and wherein the lead electrodes extend onto the silicon oxide film because the electrode size is too small for direct attachment of the lead wires. FIG. 3*a* shows a cross sectional view taken along the line A–A′ of FIG. 3*b*. As before, for convenience the same numerals indicate similar portions to those in FIGS. 1*a* through 1*j*.

FIGS. 4*a* and 4*b* show a conventional NPN silicon planar transistor with extended electrodes. FIG. 4*a* is a cross sectional view taken along the line A–A′ of FIG. 4*b*. The same numerals refer to portions similar to those in FIGS. 3*a* and 3*b*.

In extended electrode structures, a capacitance is introduced between the extended lead electrodes 12 and 13 on the oxide film 4 and the collector region 1 which is added to the transistor parameters. In a device with small dimension (such as found in ultra high frequency transistors), this additional capacitance becomes comparable to the collector-base junction capacitance, with the result that the stability of power gain is considerably deteriorated. This additional capacitance exists by virtue of the lead electrodes 12 and 13 silicon oxide film 4 and collector region 1; the capacitance value being directly proportional to the dielectric constant of silicon oxide and inversely porportional to the thickness of the film 4. Accordingly, it is desirable that the silicon oxide film be as thick as possible. With conventional planar transistors, such as shown in FIGS. 4*a* and 4*b*, however, the thickness is limited by the dimensions of the device, the fabrication method, and the photoetching technique; the upper limit of the film thickness being 1–1.5 microns.

In acordance with the present invention, the junction portions of the device are formed within the mesa portion of the silicon substrate 1, and hence the thickness of the silicon oxide film over the collector electrode is not limited by the foregoing factors. Accordingly, the thickness may be chosen as required, thus greatly decreasing the aforementioned additional capacitance.

In detail, the thickness of the silicon oxide film, in the transistor according to the present invention, is 1–1.5 microns on the mesa portion, namely on the base region 6, which is the same figure as for the conventional planar type device; however, it is much greater on the other portion, namely, on the collector region 1, as shown in FIG. 3*a*. The thickness of the silicon oxide film 4 in the conventional transistor, on the other hand, is substantially uniform over the base region 6 and the collector region 1 as shown in FIG. 4*a*. Accordingly, the additional capacitance between the extended lead electrode 12 and 13 and collector region 1 in the structure of this invention is smaller as compared with the conventional structure since, as mentioned, the capacitance is inversely proportional to the film thickness between the extended electrode and the collector region. The thickness of the silicon oxide film 4 on the collector region 1 may be increased by increasing the height of the mesa portion, while the silicon oxide film formed on the mesa portion may be kept the same as the conventional planar type semiconductor device. The same effect may be obtained for diodes by utilizing the present invention. Such a diode would be simply fabricated by forming an extended electrode on the structure shown in FIG. 1*e*.

Further, the breakdown voltage of the junction can be made higher in accordance with the present invention. The breakdown voltage refers to that of the collector-base junction in transistors and that of the junction in diodes. As may be seen in FIG. 2*a*, a portion of the collector-base junction in a conventional NPN silicon planar transistor commonly extends to the surface of the silicon substrate. Inasmuch as the surface is preliminarily mirror-polished with an abrasive, damage is caused near the surface of the silicon substrate due to the abrasive action, resulting in a lower breakdown voltage of the junction near the surface than that of the interior junction. It has been found that, in the ordinary planar transistor where the silicon oxide film is formed thermally after the base region 6 is formed, the lower surface breakdown voltage of the collector-base junction results partly from the change in the impurity concentration distribution near the surface due to the difference in the impurity distribution coefficients in the base region 6 and silicon oxide 4.

The collector-base junction in the mesa type device does not extend to the surface as in the planar type device, and hence, a deterioration of the breakdown voltage is not created by the above-mentioned reasons. However, it is known that in the breadwon voltage in the mesa type device is apt to vary due to the surface contamination and environmental conditions which affect the exposd junction. With the structure in accordance with the present invention, the junction extends to the surface without any such defect as in the conventional planar structure, and furthermore, the collector-base junction is completely covered with silicon oxide film 4 and protected against contamination and the environment, as is apparent from FIGS. 1*a* through 1*i*.

Another advantage in the breakdown voltage of the device of the present invention comes from the shape of the collector-base junction. It is known that the mesa type device has a higher breakdown voltage than the planar type device due to the difference in their junction shape; a difference which is effected even when the PN junctions are formed in substrates with the same resistivity in the same impurity diffusion condition. In the former, or mesa type device, the collector-base junction is substantially in a flat plane, whereas in the latter, it has a cup shape as shown in FIG 2*a*. The difference in the breakdown voltage of the junctions of the two types becomes greater in shallower junctions. The collector-base junction in accordance with the present invention may be formed within the mesa portion of the substrate 1, resulting in a substantially plane shape, and hence the disadvantages of the planar type devices are eliminated.

While the principles of the invention have been described in connection with specific apparatus, it is to be clearly understood that this description is made only by way of example and not as a limitation to the scope of the invention as set forth in the objects thereof and in the accompanying claim.

What is claimed is:

1. The method of fabricating a semiconductor device comprising the steps of: selectivity forming a silicon oxide film on a portion of the surface of a silicon semiconductor substrate heating and oxidizing in oxidizing atmosphere said substrate with the partially formed silicon oxide film thereby forming a mesa structure at the interface of the grown and said partial silicon oxide films and said silicon semiconductor substrate due to the difference in the oxidation rates at the surface; removing at least a portion of said oxide film on said mesa portion; forming at least one p-n junction within said mesa structure; forming a silicon oxide film on the surface of said mesa structure, leaving at least one opening therethrough; and attaching at least one electrode to said silicon substrate through said opening.

References Cited

UNITED STATES PATENTS

| | | | |
|---|---|---|---|
| 2,981,877 | 4/1961 | Noyce | 148—187 |
| 3,279,963 | 10/1966 | Castrucci | 148—188 |
| 3,442,011 | 5/1969 | Strieter | 29—578 |
| 3,445,303 | 5/1969 | Engbert | 148—187 |
| 3,484,313 | 12/1969 | Tauchi et al. | 148—187 |

L. DEWAYNE RUTLEDGE, Primary Examiner

R. A. LESTER, Assistant Examiner

U.S. Cl. X.R.

29—578; 148—175, 187, 188